United States Patent
Casparian et al.

(10) Patent No.: US 10,862,482 B2
(45) Date of Patent: *Dec. 8, 2020

(54) SYSTEM AND METHOD FOR CONTROLLING AN ELECTRO-PERMANENT MAGNET KEY SWITCH ASSEMBLY

(71) Applicant: Dell Products, LP, Round Rock, TX (US)

(72) Inventors: Mark A. Casparian, Miami, FL (US); Jason S. Morrison, Chadron, NE (US)

(73) Assignee: Dell Products, LP, Round Rock, TX (US)

( * ) Notice: Subject to any disclaimer, the term of this patent is extended or adjusted under 35 U.S.C. 154(b) by 91 days.

This patent is subject to a terminal disclaimer.

(21) Appl. No.: 16/405,555

(22) Filed: May 7, 2019

(65) Prior Publication Data

US 2020/0358438 A1    Nov. 12, 2020

(51) Int. Cl.
| | |
|---|---|
| *H03K 17/972* | (2006.01) |
| *H01H 36/00* | (2006.01) |
| *H01F 7/06* | (2006.01) |
| *H01F 7/02* | (2006.01) |
| *G06F 3/01* | (2006.01) |

(52) U.S. Cl.
CPC ......... *H03K 17/972* (2013.01); *H01F 7/0273* (2013.01); *H01F 7/064* (2013.01); *H01H 36/004* (2013.01); *G06F 3/016* (2013.01)

(58) Field of Classification Search
CPC .............. H01H 13/7065; H01H 13/72; H01H 2221/04; H01H 2227/036; H03K 17/969; H03K 17/97; H03K 17/9505; H03K 17/972; H03K 2217/96023; H03K 2217/96042; G06F 3/0202; G06F 3/0219; G06F 3/0238; H01F 7/0226
See application file for complete search history.

(56) References Cited

U.S. PATENT DOCUMENTS

| | | | | |
|---|---|---|---|---|
| 4,879,557 A | * | 11/1989 | Roche ................... | G06F 3/0238 341/23 |
| 5,990,872 A | * | 11/1999 | Jorgenson ............. | G06F 1/1616 345/157 |

(Continued)

*Primary Examiner* — Hai Phan
*Assistant Examiner* — Son M Tang
(74) *Attorney, Agent, or Firm* — Prol Intellectual Property Law, PLLC; H. Kenneth Prol

(57) ABSTRACT

An electro-permanent magnet (EPM) key assembly of an information handling system may comprise a pair of scissor plates operably connected to a base contact assembly including an EPM such that each of the pair of scissor plates may rotate away from one another in the presence of downward force on a key cap situated atop the pair of scissor plates for actuation of the EPM key assembly; the EPM comprising a low-coercivity magnet and a high-coercivity magnet; wherein an application of a first current pulse applied to an electrically conductive wire coiled around the low-coercivity magnet places the EPM in a first on state to assert a first magnetic field on a ferromagnetic flange operatively coupled to rotate with at least one scissor plate about a hinge; and wherein an application of a second current pulse applied to the electrically conductive wire places the EPM in a second on state to increase the magnetic field on the ferromagnetic flange.

19 Claims, 7 Drawing Sheets

(56) References Cited

U.S. PATENT DOCUMENTS

| | | | |
|---|---|---|---|
| 8,264,465 B2* | 9/2012 | Grant | G06F 3/016 345/173 |
| 10,222,872 B1* | 3/2019 | Morrison | G06F 1/1671 |
| 2006/0068921 A1* | 3/2006 | Cheng | A63F 13/837 463/51 |
| 2008/0229904 A1* | 9/2008 | Komatsu | G10H 1/346 84/439 |
| 2009/0296328 A1* | 12/2009 | Lin | G06F 1/1686 361/679.02 |
| 2011/0096008 A1* | 4/2011 | Furukawa | G06F 3/0338 345/173 |
| 2011/0148768 A1* | 6/2011 | Ladouceur | H01H 13/7065 345/169 |
| 2013/0154940 A1* | 6/2013 | Gan | H01H 36/0073 345/168 |
| 2014/0002366 A1* | 1/2014 | Gluckstad | G06F 3/0202 345/168 |
| 2014/0281618 A1* | 9/2014 | Sultenfuss | G06F 1/30 713/323 |
| 2015/0332875 A1* | 11/2015 | Hsu | H01H 3/125 200/344 |
| 2015/0341030 A1* | 11/2015 | De Saulles | G06F 3/0221 341/32 |
| 2017/0322634 A1* | 11/2017 | Morrison | G06F 3/0216 |
| 2018/0219552 A1* | 8/2018 | Casparian | H01F 7/204 |
| 2018/0219553 A1* | 8/2018 | Casparian | G06F 3/0219 |
| 2019/0041995 A1* | 2/2019 | Kotta | H01H 13/7065 |
| 2019/0129515 A1* | 5/2019 | Morrison | H01H 13/84 |
| 2019/0129516 A1* | 5/2019 | Morrison | G06F 1/1662 |
| 2019/0326081 A1* | 10/2019 | Kurma Raju | H01H 3/125 |

* cited by examiner

SYSTEM AND METHOD FOR CONTROLLING AN ELECTRO-PERMANENT MAGNET KEY SWITCH ASSEMBLY

FIELD OF THE DISCLOSURE

The present disclosure generally relates to a key switch assembly of, for example, an information handling system. The present disclosure more specifically relates to the use of electropermanent magnets in a key switch assembly of a keyboard.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
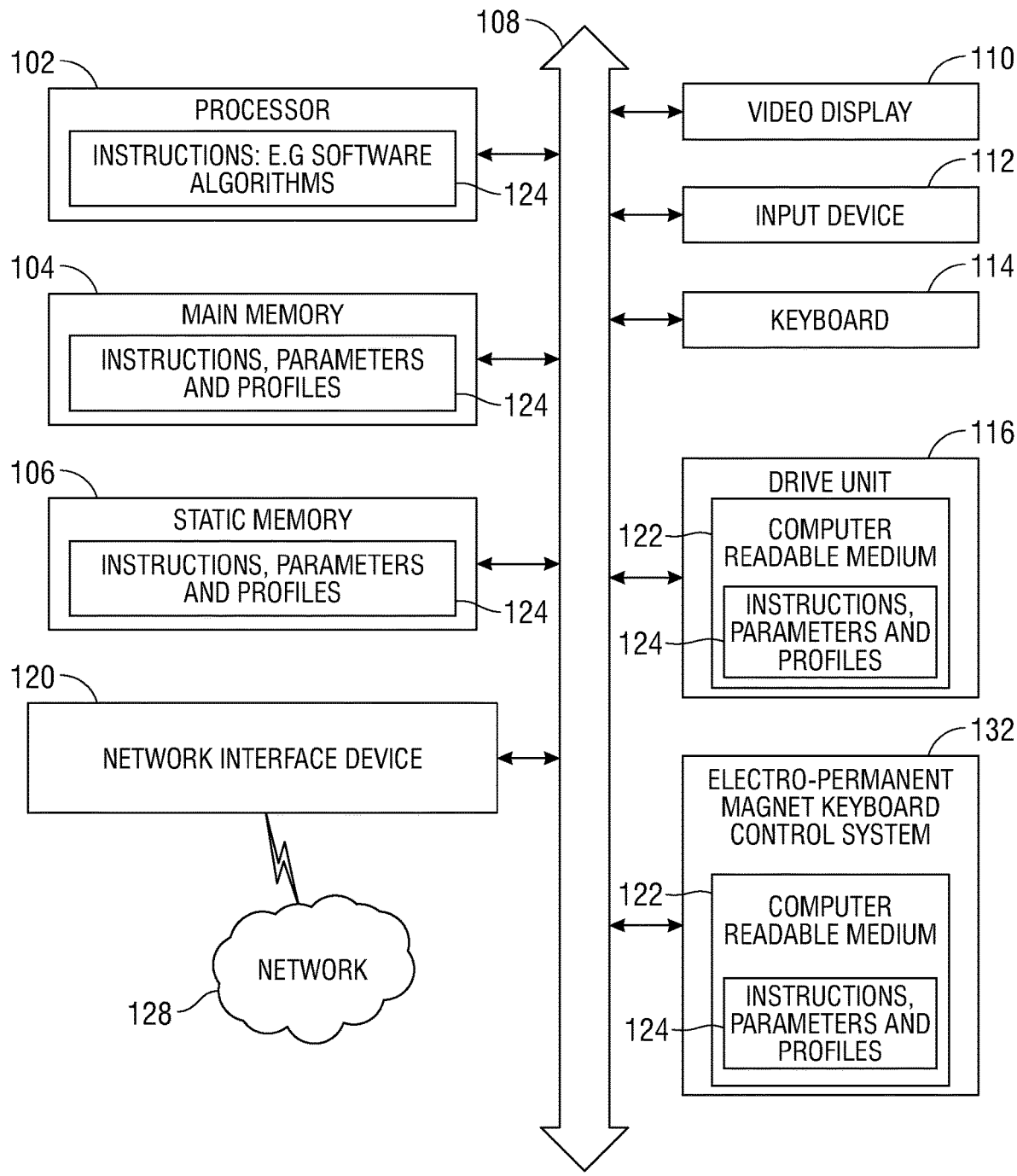
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a key assembly that may include a key cap situated atop two scissor plates that may rotate outward from one another as a user applies downward force to the key cap (e.g., pressing the key). In embodiments of the present disclosure, the outward rotation of the scissor plates caused by the user applying downward force on the key cap may simultaneously cause a flange susceptible to magnetic forces to rotate away from a magnet situated beneath the scissor plates. Once the user removes the downward force in such an embodiment, the magnet may exert a magnetic force to pull the flange operably connected to the scissor plates back toward the magnet. This may cause the scissor plates to rotate toward one another, pushing the key cap back to its neutral position, flush with the surface of the keyboard.

In addition to providing sufficient upward force to return the key back to its neutral position, use of such a magnetic key assembly in an embodiment may supply a consistent upward force the user must overcome in order to depress the key cap far enough for the information handling system to register its depression as a keystroke. This resistive key force may feel to the user as if the key cap is travelling a deeper distance into the keyboard than it actually is. This may, accordingly, reduce the actual thickness of the keyboard while still maintaining a tactile sensation to a user that the keyboard is robust than it is. Additionally, the used of the magnetic key assembly in the keyboard may reduce the materials used to form the keyboard thereby reducing costs and weight of the keyboard.

Permanent magnets may be employed in magnetic keyboard assemblies in order to generate the upward force necessary to return the key cap to a neutral position and provide the user with the desired tactile sensation while depressing the key cap. However, magnetic fields generated by such permanent magnets cannot be adjusted, but rather, provide the same attractive force consistently. As such, the use of permanent magnets may not allow for an adjustment.

Embodiments of the present disclosure employ electropermanent magnets (EPMs) in the key assembly in order to provide an adjustable upward force to return each key cap to its neutral position, and to allow each key to be placed in a plurality of neutral positions such as a raised neutral or a retracted, depressed position. In the present description and in the appended claims, the term "neutral" is meant to be understood as a position of the EPM key assembly that is raised. In an example, a neutral EPM key assembly is in a position to receive actuation force from a user so as to receive input from a user at the EPM key assembly. In the present description and in the appended claims, the term "retracted" is meant to be understood as a position of the EPM that is lowered. In an example, the retracted EPM key assembly is in a position such that it appears to or cannot receive input from a user via any actuation by the user.

Embodiments of the present disclosure describes each EPM key assembly that may include a separate electropermanent magnet, which may be controlled on an individual basis by an electropermanent magnet keyboard control system. Such embodiments allow the user to set an entire keyboard or even a single key within the keyboard to be retracted and deactivated via turning the EPM for that key or keys to an off state. In other embodiments, an entire keyboard or specific keys may also be set to a specific resistive force chosen by the user to provide the optimal tactile sensation for that user if a multi-level EPM is used in the key assembly. The low intensity magnetic field generated by such an electropermanent magnet in embodiments of the present disclosure may thus allow for more granular control of each key.

In order to ensure such a low intensity magnetic field is also sufficient to return the key cap to its neutral position, embodiments of the present disclosure may also add flange protrusions to the flanges operably connected to the scissor plates that are to be drawn toward the magnet to place the key cap back in its neutral position. These flange protrusions may wrap around the external sides of the electropermanent magnet in embodiments, in order to increase the cross-sectional surface area in which the flanges operably connected to the scissor plates overlaps the magnetic field of the electropermanent magnet. As the overlapping surface area increases, so too does the force with which the electropermanent magnet draws the flanges operably connected to the scissor plates toward it. Using such an electropermanent magnet key assembly may provide an upward force to return each key cap to its neutral position when the EPM is in an on state.

The proximity between the interior surfaces of the flange protrusions and the exterior sides of the magnetically soft shunts of the electro-permanent magnet may set to increase the ability of the magnetic field generated by the electro-permanent magnet and propagated by the magnetically soft shunts in embodiments to draw the flange protrusions toward the magnetically soft shunts and electro-permanent magnet. As such, a method or mechanism capable of maintaining the critical proximity between the interior surfaces of the flange protrusions and the exterior sides of the magnetically soft shunts may be used.

Actuation of the electro-permanent magnet (EPM) within the EPM key assembly may be accomplished through charging a low-coercivity magnet among a one or more of high-coercivity magnets by passing a current through an electrically conductive wire wrapped around the low-coercivity magnet in order to align the polarities of the low- and high coercivity magnets. A single current pulse applied to the conductive wire may not fully charge the low-coercivity so as to sufficiently provide a key force resistance to a user actuating the EPM key assembly. However, a single low current pulse may still cause a retracted key assembly to raise up raised neutral position.

In order to increase the key force resistance sufficiently to allow a user to have the impression of actuating the EPM key assembly, the present disclosure describes a process or method of controlling an electro-permanent magnet (EPM) key assembly of an information handling system using two current pulses. In an example, the two current pulses may be lower than a maximum current pulse that may be used to reverse the polarity of the low-coercivity magnet and increase the flux density B and/or magnetic field strength H of the low-coercivity magnet. In an embodiment, this process or method may include the application of a first current pulse to the electrically conductive wire followed by a time delay and a second current pulse to the electrically conductive wire. The first current pulse may place the low-coercivity magnet at a first magnetic flux density B that, in an example, aligns a polarity of the low-coercivity magnet with that of a high-coercivity magnet associated with the low-coercivity magnet within the EPM. The second current pulse may then place the low-coercivity magnet at a second, higher magnetic flux density B relative to first magnetic flux density B. This allows for the electro-permanent magnet (EPM) key assembly to selectively be placed in a retracted position and a normal position using the EPM with lower power pulses and smaller drivers used to produce those relatively lower current pulses. This may reduce the power used to place the EPM key assemblies in a neutral state, save costs associated with manufacturing the EPM key assemblies, and reduce any heat produced by the EPM key assemblies. When not in use or not to be in use, the keys of the EPM key assembly may be retracted to prevent any actuation of the key by the user or to prevent damage of the keys when not in use. In some embodiments of the present disclosure, the length of time of the delay between the application of the first and second current pulses used to achieve the second, higher magnetic flux density B may be dependent on the current applied to the electrically conductive wire or the voltage used to generate that current, the distance of the flange to the EPM, the weight of the flange/key, or combinations thereof. With these parameters in mind, the force used to actuate the EPM key assembly by a user may be adjusted based on the user's selected parameters, parameters of an application executed by a processing device of the information handling system, or combinations thereof. Thus, the user may cause the force used to actuate the EPM key assembly to be adjusted before and during interacting with the information handling system.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 can include one or more storage devices, one or more communications ports for communicating with external devices, as well as, various input and output (I/O) devices, such as a keyboard, a mouse, a video/graphic display, or any combination thereof. The information handling system 100 can also include one or more buses operable to transmit communications between the various hardware components. Portions of an information handling system 100 may themselves be considered information handling systems 100.

Information handling system 100 can include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 of the electropermanent magnet keyboard control system 132, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, a solid-state display, or a cathode ray tube (CRT). Additionally, the information handling system 100 may include an input device 112, such as a cursor control device (e.g., mouse, touchpad, or gesture or touch screen input, and a keyboard 114. The information handling system 100 can also include a disk drive unit 116.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other networks. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are proprietary but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well.

In some embodiments, software, firmware, dedicated hardware implementations such as application specific integrated circuits, programmable logic arrays and other hardware devices can be constructed to implement one or more of some systems and methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer-based functions disclosed herein. For example, instructions 124 may execute an electropermanent magnet keyboard control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the electropermanent magnet keyboard control system 132 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 may also contain space for data storage. Further, the instructions 124 may embody one or more of the methods or logic as described herein. For example, instructions relating to the electropermanent magnet keyboard control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the electropermanent magnet keyboard control system 132 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The electropermanent magnet keyboard control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the electropermanent magnet keyboard control system 132 that may be operably connected to the bus 108. The electropermanent magnet keyboard control system 132 computer readable medium 122 may also contain space for data storage. The electropermanent magnet keyboard control system 132 may, according to the present description, perform tasks related to controlling the magnetic field generated by an electropermanent magnet within a key switch assembly and/or turning EPMs from an on state to an off state or vice-versa among a plurality of keys. In some embodiments, a current level in a plurality of low-coercivity magnets may correspond to a user-selected magnitude when a stepped electro-permanent magnet system is used.

In an embodiment, the electropermanent magnet keyboard control system 132 may communicate with the main memory 104, the processor 102, the video display 110, the alphanumeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. In an embodiment an information handling system 100 may include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
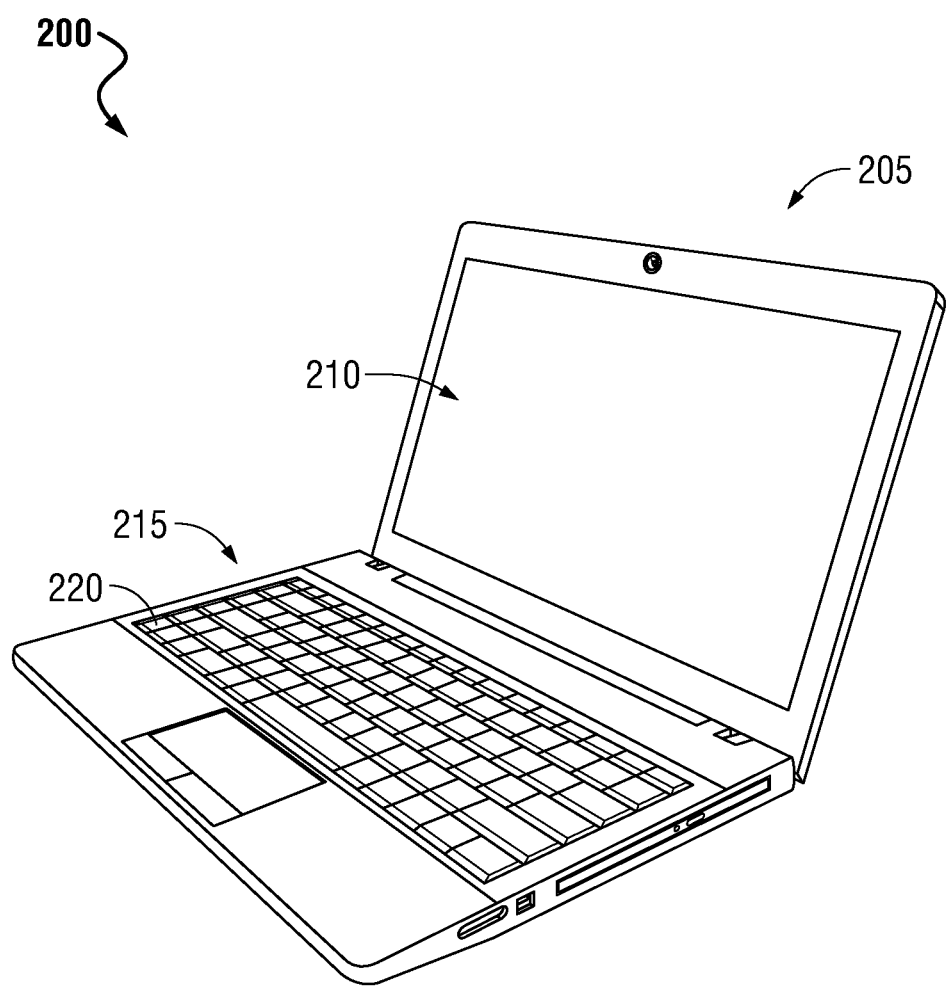
FIG. 2 is a perspective graphical diagram of an information handling system with an electropermanent magnet keyboard control system according to an embodiment of the present disclosure.

FIG. 2 is a perspective graphical diagram of an information handling system 200 with an electropermanent magnet keyboard control system 132 according to an embodiment of the present disclosure. Although FIG. 2 depicts the information handling system 200 as being implemented in a laptop computing device 205, FIG. 2 is not meant to be limiting and the present specification contemplates that the use of other types of computing device as described herein. In the example, the laptop computing device 205 may include a screen portion 210 and a keyboard portion 215. The screen portion 210 may include any device that can present to a user any visual data as output to a user in response to input and execution of the instructions, parameters, and profiles 124 by the processor 102 described in connection with FIG. 1. In an example, a graphical user interface may be presented to a user to input any number of parameters descriptive of the actuation force used to actuate any number of keys 220 present on the keyboard portion 215 of the laptop computing device 205.

The keyboard portion 215 may include any number of keys 220 arranged in any manner so as to receive input from a user via selective actuation of those keys 220. In an embodiment, the keys 220 may be arranged similar to a QWERTY-type keyboard layout or any other alphabetic, symbolic, and/or numeric layout. In an embodiment, the keys 220 may be any number of keys from 1 to infinity.

In an embodiment of the present description of the keys 220 may each be associated with an electro-permanent magnet (EPM). The EPM may be used to selectively attract a flange coupled to a pair of scissor plates and a key cap as described herein. The EPM may selectively attract the flange through application of a current to an electrically conductive wire coiled around a low-coercivity magnet among a number of high-coercivity magnets. Application of this current to cause the poles of the low-coercivity magnet to line up with the poles of the high-coercivity magnet. In such an embodiment, the magnetic fields of the high-coercivity magnets and the low-coercivity magnet may compound to generate a magnetic field having an intensity greater than that of either the high-coercivity magnetic field or the low-coercivity magnetic field alone. This compounded magnetic field may be arranged so as to selectively attract the flange towards the EPM thereby causing the individual keys 220 to raise. Accordingly, when an opposite voltage is applied to the electrically conductive coil, a current is passed through the electrically conductive coil resulting in the poles of the magnetic field generated by the low-coercivity magnets being placed in a magnetic state opposite the poles of the magnetic field generated by the high-coercivity magnet. This results in the EPM being placed in an off state thereby being rendered incapable of sufficiently attracting the flange. This results in the individual keys 220 being placed in a recessed state. In this state, the keys 220 may be rendered inoperable, that is, incapable of receiving input from a user via actuation of those recessed keys 220.

The information handling system 200 may include an electropermanent magnet keyboard control system 132 as described herein. In an embodiment, the electropermanent magnet keyboard control system 132 may include one or more sets of instructions that, when executed by a processor, causes a first current pulse to be applied to an electrically conductive wire coiled around a low-coercivity magnet as described herein. The one or more sets of instructions of the electropermanent magnet keyboard control system 132 may also include one or more sets of instructions that, when executed by a processor, causes a second current pulse to be applied to the electrically conductive wire after a passage of time from the application of the first current pulse in an embodiment. In this manner, the low-coercivity magnet may be set initially to a first charge state. This first charge state, however, may initially raise the key cap and flange of the EPM key assembly up, but may also have a weak or unusable actuation key force if and when a user attempts to actuate the key. By execution of the electropermanent magnet keyboard control system 132, however, application of the second current pulse places the low-coercivity magnet in a second and relatively higher charge state. In this second charge state, the force used to actuate the key is higher providing a relatively more robust tactile feel for a user.

In an embodiment, the actuation force of the key after the first current pulse may be between 10 and 20 grams. That is, after application of the first pulse, the key of the EPM key assembly may be actuated when between 10 and 20 grams of actuation force is applied to the key. In an embodiment, after application of the first pulse, the key of the EPM key assembly may be actuated when 15 grams of actuation force is applied to the key. The first current pulse, however, raises the key cap quickly form a retracted state so the user may perceive the key caps rising to a raised and neutral position.

In an embodiment, the actuation force of the key after the second current pulse may be between 50 and 70 grams. That is, after application of the second pulse, the key of the EPM key assembly may be actuated when between 50 and 70 grams of actuation force is applied to the key. In an embodiment, after application of the second pulse, the key of the EPM key assembly may be actuated when 60 grams of actuation force is applied to the key providing a more robust key actuation tactile feel.

The electropermanent magnet keyboard control system 132 may also include one or more sets of instructions that, when executed by the processor, causes time to pass between the application of the first current pulse and the second current pulse. This delay period after the application of the first current pulse may be dependent on a number of factors including the voltage of the first current pulse, the distance of the flange relative to the EPM, the physical weight of the key and flange, among other factors. In an embodiment, the delay period may be between 0.5 milliseconds and 2.5 milliseconds. In an embodiment, the delay period may be between 1 millisecond and 2 milliseconds. In these embodiments, a user may therefore see the keys initially rise from an inoperable state via application of the first current pulse thereby indicating that the user may begin to actuate the keys. However, in an embodiment, after a delay of between 0.5 and 2.5 milliseconds, the keys may have a resistive force sufficient to for a user to feel as if the key is sufficiently resistive to actuate with an improved tactile feel.

In an embodiment, the application of the first and second current pulses to any of the EPM key assemblies may be dependent on a threshold number of EPMs within those EPM key assemblies that are to be actuated. In an embodiment, where the number of EPM key assemblies to be actuated is 10 EPM key assemblies or less, the first current pulse, delay, and then the second current pulse may be applied to all EPM key assemblies concurrently. In this embodiment, the first current pulse may be applied to the EPM key assemblies concurrently, followed by a time delay, and then the application of the second current pulse to all EPM key assemblies concurrently.

In an embodiment where the number of EPM key assemblies is greater than 10, the first current pulse may be applied to each of the individual EPM key assemblies in a round-robin fashion. In another embodiment, the first 10 EPM key assemblies may be actuated by the first and second current pulses concurrently followed by a round-robin application of the first current pulse to any remaining keys followed by a second current pulse. In the round-robin embodiment, the second current pulse may then be applied in a round robin fashion after it has been determined that a sufficient delay period has passed for any given EPM key assembly. In this case, the delay period may have already passed from the application of the first current pulse for the first EPM key assembly after the round robin procedure in time for the second current pulse to be applied. Because the applications of the first and second current pulses and the delay period is so short (on the order of micro- and milliseconds respectively) a user may not be able to discern or react in any manner to the EPM key assembly charging methods described herein. Instead, the user may simply see all the individual keys raise up. By the time the user has touched the EPM key assemblies, the second pulse would have been applied to the EPMs and the user can interact with a relatively more resistive set of EPM key assemblies.

In an embodiment, the keys available to a user may exceed 10 on, for example, a keyboard. In this embodiment, a first set of 10 keys described herein may be selected among all possible keys that is to be raised to the neutral position. In this example the selection of which 10 keys that are selected may be based on the most user-actuated keys available on the keyboard. Thus, in this embodiment, the first set of 10 keys may be raised via the methods described herein prior to any other keys being raised. Similarly, the first set of 10 keys may have the second current pulse applied to the electrically conductive wire prior to any other keys available on the keyboard. Consequently, those keys most used by the user may be raised prior to any other keys.

In an embodiment, the application of the first and second current pulses to any of the EPM key assemblies may be dependent on an application being executed on the laptop computing device 205. By way of example, a user may be engaged in providing input, via the keys 220 of the keyboard portion 215, to a processor of the laptop computing device 205 in order to cause output to be provided. In a specific example, this may be in the form of an interaction with a game being executed on the laptop computing device 205. During engagement with the game play, certain keys may be disable based on certain scenarios or occurrences during game-play. Upon these scenarios or occurrences, the processor may receive instructions to disable the keys by providing a current to any given EPM associated with any given EPM key assembly in order to retract that key. In this case, a reverse voltage current pulse is sent to the EPM in order to disable the magnetic field created by the low-coercivity magnet of the EPM thereby causing the key to fall down. Similarly, in this embodiment, upon certain other scenarios or occurrences, the key may once again be enabled when the processor receives a signal to once again enable that key. This is done by repeating, for this specific key or any given key that has been disabled, the processor of sending the first current pulse to the EPM and then sending the second current pulse to the EPM after a delay period. The reasons as to if and when any key is enabled, disabled, and/or re-enabled may be dependent on the input provided to the laptop computing device 205 upon execution of the application (such as the gaming application in this embodiment) as well as the output provided by that execution of the application.

Figure 3:
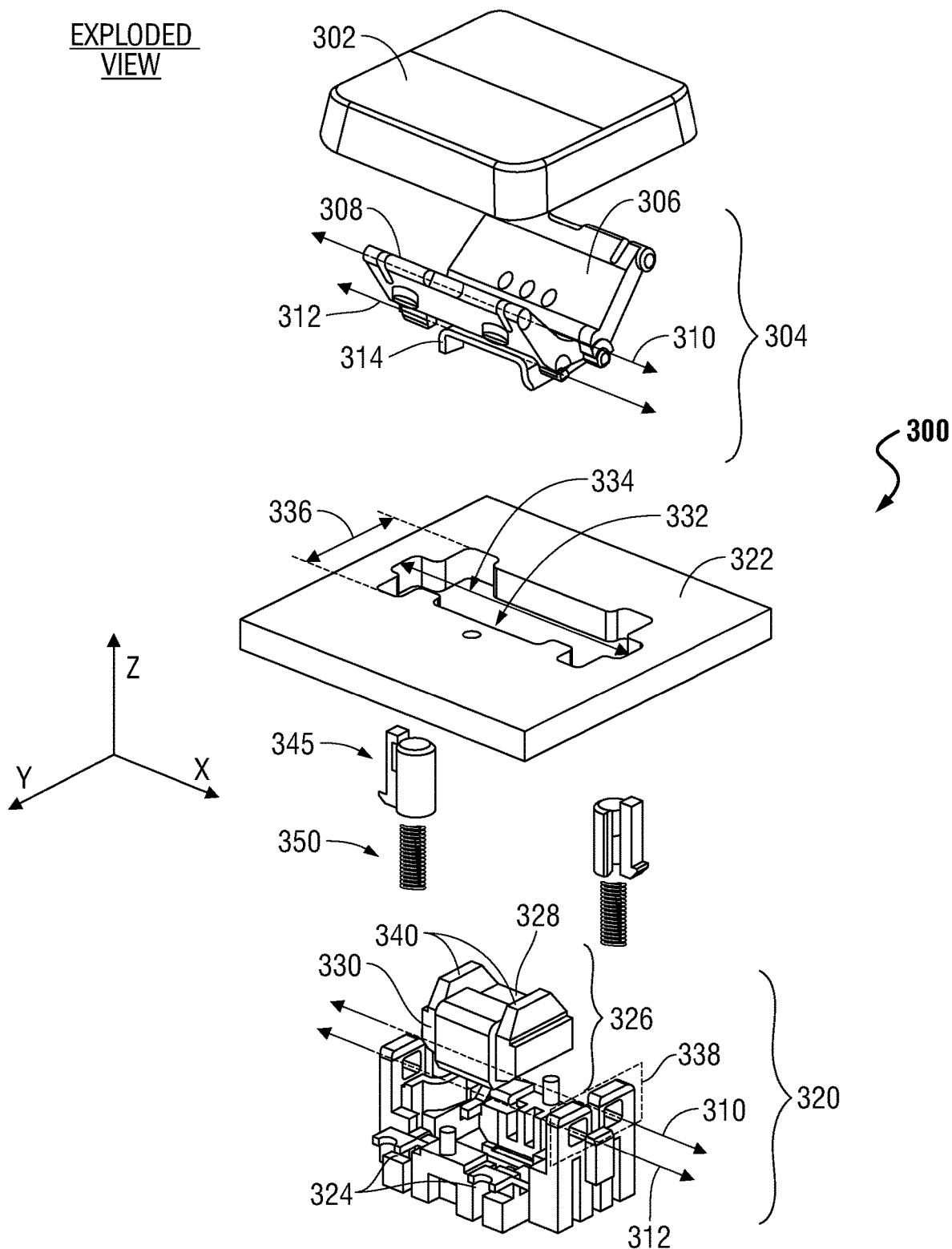
FIG. 3 is an exploded, perspective graphical diagram view of an EPM key assembly according to an embodiment of the present disclosure.

FIG. 3 is an exploded, perspective graphical diagram view of an EPM key assembly 300 with according to an embodiment of the present disclosure. In an embodiment, the EPM key assembly 300 may include an electropermanent magnet (EPM) 326 and a scissor plate flange 314 for magnetic attraction between the flange 314 and the EPM 326. The scissor plate flange 214 may include flange angular protrusions that wrap around outer surfaces of one or more magnetically soft shunts 340 of the EPM 326. As described herein, the force the magnetic field generated by the EPM 326 and propagated by the magnetically soft shunts 340 exerts on the flange 314 may decrease as the distance between the flange 314 and the magnetically soft shunts 340 increases. An EPM key assembly 300 in an embodiment may enable an information handling system 200 to register a keystroke entered by a user via a keyboard 215. Each key 220 within such a keyboard 215 may include one or more EPM key assemblies 300, and may comprise a key cap 302 lying atop a scissor plate assembly 304 in an embodiment.

The scissor plate assembly 304 in an embodiment may include a rear scissor plate 306 and a front scissor plate 308, the top portions of which (e.g., portions located furthest from a rotation axis 310 and 312) may rotate away from one another when a sufficient downward force is exerted on the key cap 302. Such a rotation in an embodiment may cause either a portion of the scissor plates 306 and 308 themselves, or a mechanism operably attached to the scissor plates 306 and 308 to come into contact with a sensor to indicate the key has been depressed. In such a way, the rotation of the scissor plates 306 and 308 may be actuated while the information handling system 200 registers occurrence of a keystroke.

The scissor plates 306 and 308 in an embodiment may be operably connected to a base contact assembly 320 and a cap support plate 322 immovably fixed to the keyboard portion 220 of the information handling system 200 during operations of the key assembly 300. In other words, depression of the key cap 302 in an embodiment may not cause any vertical movement of the base contact assembly 320 or of the cap support plate 322 during actuation. The cap support plate 322 in an embodiment may have an opening 332 formed vertically through the cap support plate 322 such that objects may pass vertically through the opening 332. The base contact assembly 320 in an embodiment may include one or more scissor plate mounts 338 composed of vertical structures having eye holes disposed horizontally such that objects may pass horizontally through the eye holes in the scissor plate mounts 338. The scissor plate mounts 338 in such an embodiment may be disposed vertically through the opening 332 of the support plate 322 in an embodiment. The cap support plate opening 322 in an embodiment may have a width 334 and a depth 336 sufficient to allow vertical passage of the scissor mounts 338 upward through the opening 332 of the support plate 322. In such an embodiment, scissor plate mounts 338 integrated with or mounted to base contact assembly 320 including the EPM 326 ensure alignment of the scissor plate assembly 304 with the base contact assembly 320 as mounted in a single-plate cap support plate 322. Cap support plate 322 may be a printed circuit board (PCB) with pressure or switch sensors mounted thereon (not shown) to register keystrokes.

In other embodiments, the cap support plate 322 may be formed to include the scissor mount integrated with cap support plate 322 (not shown). For example, the cap support plate 322 may be formed such that a scissor mount projects vertically upward from the cap support plate 322. In an embodiment such as with which the cap support plate 322 is formed using a three-dimensional printing method, the cap support plate 322 and scissor mount may be comprised of a single structure of consistent material makeup.

The scissor plates 306 and 308 in an embodiment may then be operably connected to the scissor mount 338 such that the rotation axis for each of the scissor plates 306 and 308 transects a cross-sectional area shared by the scissor plates 306 and 308 and the base contact assembly 320. For example, in an embodiment, a pin or similar mechanism may be disposed at the scissor plates rotation axes 310 and 312 and through the one or more holes within the scissor mount 338 to form one or more hinges. In the example embodiment illustrated by FIG. 3, the rear scissor plate 306 may be joined with the scissor mount 338 in such a way to form a hinge allowing the rear scissor plate 306 and flange 314 to rotate about the rear plate rotation axis 310 that transects a cross-sectional area (e.g., in the YZ plane) shared by both the rear scissor plate 306 and the scissor mount 338. Similarly, the front scissor plate 308 may be joined with the scissor mount 338 to allow the front scissor plate 308 to rotate about the front plate rotation axis 312 transecting a cross-sectional area (e.g., in the YZ plane) shared by both the front scissor plate 306 and the scissor mount 338. In other embodiments, the front scissor plate 308 and rear scissor plate 306 may share a single rotational axis.

As described herein, the rotation of the scissor plates 306 and 308 may occur while the information handling system 200 registers occurrence of a keystroke following depression of the key cap 302 by a user. As a downward force is exerted on the key cap 302, the top portions of the rear scissor plate 306 and front scissor plate 308 may move away from one another in the Y-direction. Embodiments of the present disclosure may use methods to register keystrokes. For example, a keystroke in an embodiment described herein may be registered upon detected contact between one of the scissor plates 306 or 308 and a sensor. Such a sensor may be situated, in one example, on the top surface of the cap support plate 322, such that the bottom portion of one or both of the scissor plates 306 or 308 comes into contact with the sensor when the key cap 302 reaches its lowest allowable vertical position. The sensor may be, for example, a pressure sensor sensing the downward pressure from the scissor plate(s) 306 or 308, or in another example, an electrical contact that completes a circuit when it comes into contact with a corresponding metal contact located on the bottom portion of the one or more scissor plates 306 and 308.

In other embodiments, a portion of the key cap or scissor plates 306 and 308, or a structure extending from or operably attached to the key cap or scissor plates 306 and 308 may initiate contact with a sensor within the base contact assembly 320. For example, a scissor plate switch contact in an embodiment may be operably connected to a spring-biased rocker arm (not shown) connected to the cap support plate 322 via a hinge about which the rocker arm may rotate. Upon final construction of the whole key switch assembly 300 in an embodiment, the rocker arm may extend outward in the Y-direction, such that the scissor plate switch contact is distended slightly further forward in the Y-direction than (but at the same vertical height as) the base switch contact when the key cap 302 is in its neutral position. The scissor plate switch contact may also act as a biasing spring in an embodiment. While in the neutral position, the magnetic field of the EPM 326 may pull the scissor plate flange 314 downward toward the EPM 326, causing the bottom surface of the flange 314 to come into contact with the top surface of the portion of the rocker arm closest to the flange 314. This contact may cause the rocker arm to rotate about its hinge, such that the scissor plate switch contact is pulled in the Y-direction, away from the base switch contact.

When the key cap 302 is forced down to its depressed position in such an embodiment, the rotation of the upper portions of scissor plates 306 and 308 away from one another (in the Y-direction) may cause the scissor plate flange 314 to rotate upward such that it no longer contacts the rocker arm, allowing the spring-biased rocker arm to relax such that the scissor plate switch contact contacts the base switch contact. This contact may close a circuit, which the information handling system in an embodiment may register as a key stroke.

As described herein, embodiments of the present disclosure of the EPM key assembly 300 may include an electropermanent magnet (EPM) having an on-state and an off-state, or an adjustable magnetic field housed within the base contact assembly 320. An electro-permanent magnet, such as EPM 326 may include one or more high-coercivity magnets 328 situated nearby one or more low-coercivity magnets 330. The high-coercivity magnets 328 in an embodiment may be comprised of a combination of Neodymium, Iron, or Boron. Other embodiments contemplate the use of any of these materials individually, of other materials, or of other combinations that include these materials or others generally used to create permanent magnets, including ferrous platinum, a combination of dysprosium, niobium, gallium and cobalt, and samarium-cobalt. The low-coercivity magnets 330 in an embodiment may be comprised of a combination of aluminum, nickel, and cobalt. Other embodiments contemplate the use of other materials, or other combinations that include these materials or others, including iron, and nitrogen.

An electrically conductive wire (e.g., copper wire) may be coiled around the low-coercivity magnets 330 in an embodiment. The EPM keyboard control system 132 in an embodiment may apply a pulse of current in a first direction through the electrically conductive wires coiled around one or more of the low-coercivity magnets 330, causing the poles of the low-coercivity magnets 330 to line up with the poles of the high-coercivity magnets 328. In such an embodiment, the magnetic fields of the high-coercivity magnets 328 and low-coercivity magnets 330 may compound to generate a magnetic field having an intensity greater than that of either the high-coercivity magnetic field or the low-coercivity magnetic field alone. Such a combined magnetic field may also be propagated by one or more magnetically soft shunts 340 within the base contact assembly 320. In an embodiment, the magnetically soft shunts 340 may be made of steel or iron. The compound magnetic force generated by both the high-coercivity magnets 328 and the low-coercivity magnets 330 in such an embodiment may maintain this magnitude until another current pulse is applied to the electrically conductive wire. Thus, embodiments of the present disclosure capitalize on the advantage of electro-permanent magnets to maintain a magnetic field intensity with only a pulse of current. In contrast, electro-magnets require ongoing application of voltage to one or more magnetic components, thus depleting energy resources relatively more quickly than the EPMs described herein.

In another aspect of an embodiment, the EPM keyboard control system 132 may apply a current in a second direction, opposite the first direction, causing the polarity of the magnetic field generated by the low-coercivity magnet 330 to reverse. In such an embodiment, the poles of the magnetic field generated by the high-coercivity magnets 328 may lie opposite the poles of the magnetic field generated by the low-coercivity magnets 330. The magnetic field of the high-coercivity magnet 328 may thus negate the magnetic field of the low-coercivity magnets 330, disabling the EPM 326 such that the total magnetic force of the EPM 326 is zero or of a very low magnitude.

Embodiments of the present disclosure may employ a single EPM 326, including only one high-coercivity magnet and one low-coercivity magnet. Such a single EPM system 326 may be capable of achieving two separate states. First, the single EPM system may achieve an on state, in which the EPM 326 generates a combined magnetic field from the high-coercivity magnet and the low-coercivity magnet. Second, the single EPM system 326 may achieve an off state, in which the magnetic field generated by the high-coercivity magnet negates the magnetic field generated by the low-coercivity magnet.

In another embodiment, a dual-EPM (not shown) may be used with the key assembly of the embodiments of the present disclosure. A dual-EPM may include two high-coercivity magnets and two low-coercivity magnets. Each of the low-coercivity magnets in such an embodiment may be capable of receiving a current burst independent of the other. For example, the EPM keyboard control system in such an embodiment may apply a first current to a first low-coercivity magnet, causing the magnetic field of the first low-coercivity magnet to combine with the magnetic field of a first high-coercivity magnet. Concurrently, the EPM keyboard control system in such an embodiment may apply a second current to a second low-coercivity magnet, causing the magnetic field of the second low-coercivity magnet to negate the magnetic field of a second high-coercivity magnet. In such a way, the EPM keyboard control system 132 in an embodiment may be capable of placing a dual-EPM in one of three different states. For example, the dual-EPM may be placed in a fully on state in which both EPMs within the dual-EPM are in their respective on states, a fully off state in which both EPMs are in their respective off states, and a middle state in which one EPM is in its one state and the other is in its off state. Further gradation in overall magnetic field strength for the EPM may be achieved in other embodiments by including more than two EPMs within the key assembly 300, or by applying multiple current pulses of increasing amplitude to a single low-coercivity magnet (to increase its magnetic field strength in a step-wise fashion) as described herein. The EPM keyboard control system 132 in an embodiment may thus adjust the magnitude of the total magnetic field generated by the EPM by controlling the direction of current applied to one or more electrically conductive wires coiled around one or more low-coercivity magnets. Thus, although the present application describes various types of EPM arrangements, the present specification describes the application of a first and second current pulse to an electrically conductive wire coiled around at least one low-coercivity magnet associated with one or more high-coercivity magnets. The application of the dual current pulse with a time delay between those current pulses creates a relatively more fully charged EPM thereby increasing the actuation force required to actuate any given key. This increases the tactile responsiveness of any given key thereby increasing user satisfaction.

The EPM 326 in an embodiment may cause the key cap 302 to return to its neutral position following depression by forcing the scissor plates 306 and 308 toward one another. In an embodiment, such a force may be generated by magnetically attracting a structure, such as flange 314, operably connected to one or more of the scissor plates down toward the EPM 326. For example, the EPM 326 in an embodiment may generate a magnetic field that attracts a scissor plate flange 314 susceptible to magnetic forces down toward the EPM 326. The flange 314 in an embodiment may be comprised of a ferromagnetic material, such as steel. In such an embodiment, the scissor plate flange 314 may be operably connected to the rear scissor plate 306, and may extend from the base of the rear scissor plate, across the hinged portion of the rear scissor plate rotation axis 310 in the positive Y direction. When operably connected in such a configuration, any rotation of the scissor plate flange 314 about the rear plate rotation axis 310 may cause a rotation of the rear scissor plate 306 in the same direction about the rear plate rotation axis 310. For example, a rotation of the flange 314 about the rear plate rotation axis 310 that is counter-clockwise in the YZ plane may cause a counter-clockwise rotation of the top of the rear scissor plate 306 about the rear plate rotation axis 310. This counter-clockwise rotation may occur, for example, when the scissor plate flange 314, or a portion thereof is drawn downward toward the EPM 326. Thus, the attraction of the flange 314 toward the EPM 326 may cause the top portion of the rear scissor plate 306 to rotate toward the top portion of the front scissor plate 308, forcing the key cap 302 upward.

In an embodiment in which the scissor mount 338 is incorporated within the base contact assembly 320, the integration opening width 334 and depth 336 may be large enough to allow upward passage of the scissor mount 338 through the integration opening 332. In an embodiment in which the scissor mount 338 is incorporated within the cap support plate 322, the integration opening width 234 may be large enough to allow upward passage of a portion of the magnetically soft shunts 340 and downward passage of the flange 314 through the integration opening 332. In each of these embodiments, the dimensions of the integration opening width 334 may be sufficiently narrow such that downward pressure on the cap support plate 322 does not cause any portion of the cap support plate 322 to move vertically with respect to the base contact assembly 320. For example, a portion of the base contact assembly 320 located directly beneath the scissor mount 338 may provide structural support fixing the vertical position of the cap support plate 322 upon final integration of the EPM key assembly 300.

In an embodiment, an upward force on the key cap 302 caused by the magnetic attraction between the flange 314 and the EPM 326 in an embodiment may also control the force with which a user must press down on the key cap 302 in order for the information handling system to register a keystroke. That upward force may be biased in the opposite direction by bias springs 350. These bias springs 350 may assist in retracting the key cap 302 in some embodiments. Bias springs 350 may be mounted vertically between the scissor plate assembly 304 and the base contact assembly 320. The bias springs 350 may be vertically mounted with plungers 345 to assist in biasing the flange 314 for example. Other spring biasing, such as with a leaf spring as described in other embodiments herein may be utilized as well. The magnetic field may be generated by the EPM 326 in an embodiment throughout the vertical movement of the key cap 302 in an embodiment. Thus, a force great enough to overcome the magnetic attraction between the flange 314 and the EPM 326 must be applied to the key cap 302 in order for the contact element within or operably connected to the scissor plate assembly 304 to come into contact with the contact element or other sensor within either the cap support plate 322 or the base contact assembly 320. As described herein, such a contact may be needed in order to register a keystroke. By controlling the direction of voltage delivered to the low-coercivity magnets 330 in such an embodiment, the EPM keyboard control system 132 may also control the degree of force required to register a keystroke.

Because each EPM key assembly 300 may include an individually controllable EPM 326 in an embodiment, the EPM keyboard control system 132 may place an EPM 326 associated with particular keys or with the whole keyboard in an on or an off state. By disabling the EPM 326 completely, the EPM keyboard control system 132 may ensure the key cap 302 does not return to its neutral position, thus disallowing the user to enter a keystroke with that key. This may be useful, for example, when the information handling system 200 is a laptop computing device 205 placed in a closed configuration in which the keyboard portion 220 is placed nearby or in close contact with the display screen of the screen portion 210. In such an embodiment, the EPM keyboard control system 132 may detect that the laptop computing device 205 has been placed in the closed configuration, and disable the EPMs 326 for all of the keys in the keyboard portion 220 to draw the key caps 302 away from the display screen of the screen portion 210 such that they do not cause frictional wear and tear on the display screen. In another aspect and as described herein, this retractability may be useful in a gaming scenario in which the key being actuated represents an action currently unavailable to the user (e.g., firing of an unavailable weapon in a first-person-shooter computer game).

Further, the EPM keyboard control system 132 in an embodiment may turn the EPM 326 associated with one or more keys in an on state or an off state according to external stimuli. For example, the information handling system 200 in an embodiment may detect (e.g., via rotation sensors, hall sensors, proximity sensing elements, gyroscopes, etc.) that the information handling system 200 has been placed in a closed or tablet configuration in which the keyboard portion 220 is not likely to be used. In such an embodiment, the EPM keyboard control system 132 may place all of the EPMs 326 in an off state such that the keys cannot be actuated. In such a way, the user may continue to use the information handling system 200 in tablet mode without the risk of erroneous keystrokes. Similarly, by placing the keys in a locked depressed position when the information handling system is in a closed configuration, the EPM keyboard control system 132 in an embodiment may remove the risk of key caps 302 damaging the digital display through unintentional contact between the two.

As another example, the EPM keyboard control system 132 may set the force needed according to a received user input. This may allow each individual user to set the force required to press keys on the keyboard to a level that is tactilely pleasing to the user. In these ways, the EPM keyboard control system 132 in an embodiment may cause the EPM key assembly 300 to provide an upward force to return each key cap 302 to its neutral position, cause the EPM key assembly 300 to remain in a fixed depressed position that disallows the user to register a keystroke and/or apply a user-specified (or externally triggered) resistive key force that may be adjusted on a key by key basis via either user specified selection on a graphical user interface presented to the user or via executed instructions dictated by the instructions, parameters, and profiles 124 associated with the information handling system 200 and/or applications executed by the processor of the information handling system 200.

As another example, the EPM keyboard control system 132 may determine which EPM key assemblies among a plurality of EPM key assemblies to be raised at any given time. By way of example, the EPM keyboard control system 132 may determine which of the plurality of EPM key assemblies are used the most by any particular user and/or while using any particular application being executed on the information handling system. When the EPM keyboard control system 132 has determined which of the EPM key assemblies are used the most, it may initiate the methods described herein by raising those keys initially before any of the other plurality of EPM key assemblies. The EPM keyboard control system 132 may do so by sending the first current pulse to those EPM key assemblies before any other of the plurality of EPM key assemblies thereby raising those EPM key assemblies up. The EPM keyboard control system 132 may then send the second current pulse to the initial set of most used EPM key assemblies in order to increase the resistive force used by the user to actuate those EPM key assemblies. It us understood that the process described herein, however, may take into account any number of considerations when determining which EPM key assemblies are to be raised and when those EPM key assemblies are to be raised relative to any other set or number of EPM key assemblies. Additionally, the present disclosure contemplates that the first and second current pulses may be applied to any number of EPM key assemblies based on these considerations. Indeed, in some examples, the first current pulse may be sent to an initial set of EPM key assemblies prior to the first current pulse being sent to any other set of EPM key assemblies and prior to any second current pulse being sent to any of the EPM key assemblies.

Figure 4:
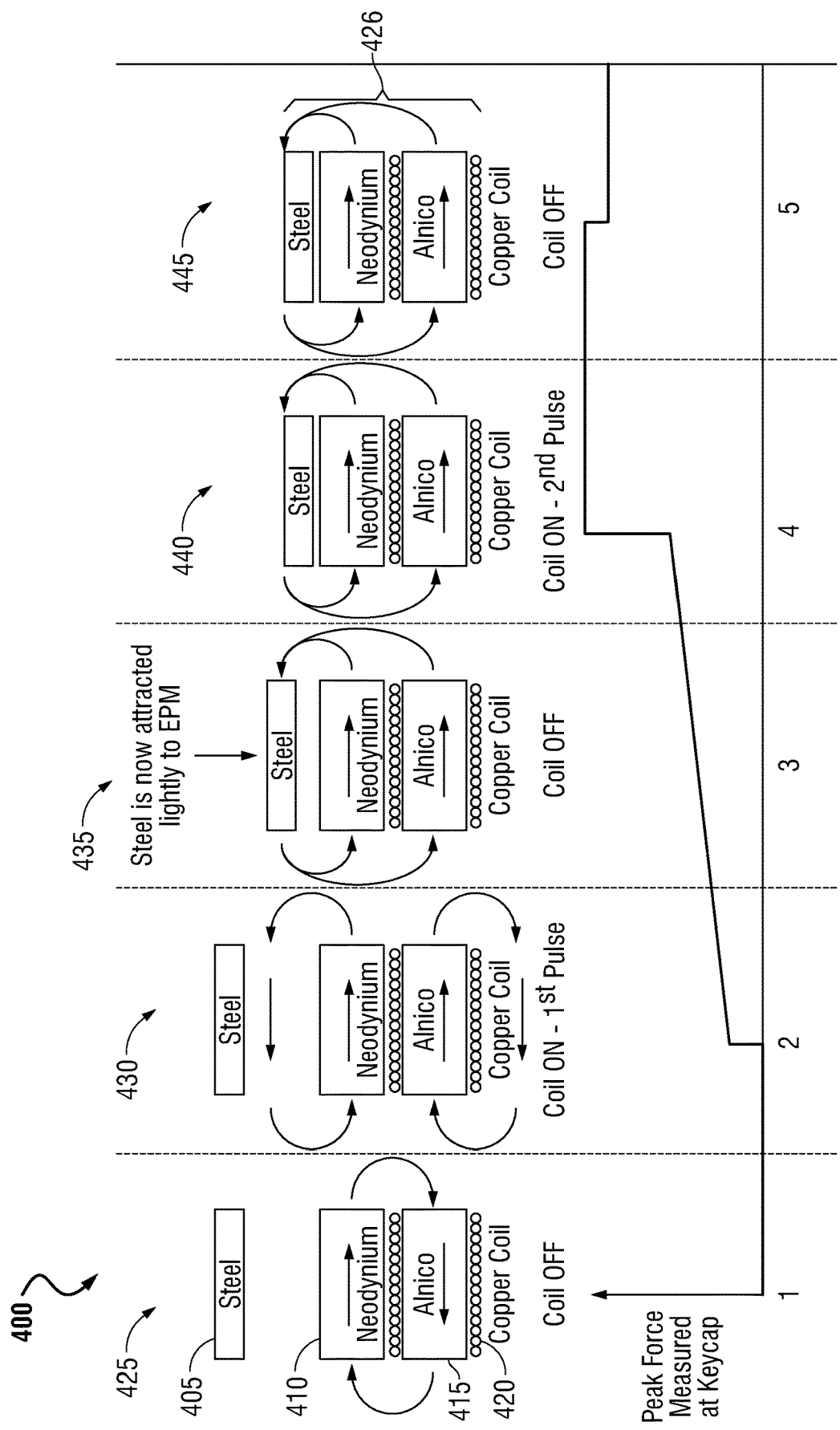
FIG. 4 is a block progression diagram of an electropermanent magnet (EPM) as it interacts with a flange as the electropermanent magnet keyboard control system is executed according to an embodiment of the present disclosure.

FIG. 4 is a block progression diagram 400 of an electropermanent magnet (EPM) 426 as it interacts with a flange 405 as the electropermanent magnet keyboard control system 132 is executed according to an embodiment of the present disclosure. The progression diagram 400 generally depicts the movement of the flange 405 (similar to 314 in FIG. 3) relative to the components 410, 415, 420 of the EPM 426 over time and during application of the first and second current pulse to a coiled wire 420 as described herein.

In a first stage 425, the flange 405 is arranged away from the EPM 326. In this embodiment shown in the first stage 425 and due to the flange 405 being coupled to at least one of the scissor plates, this indicates that no magnetic attraction or too little magnetic attraction between the flange 405 and the EPM 326 is present. In this case, no current has been sent to the electrically conductive wire 420 coiled around the low-coercivity magnet 415. As such, the magnetic forces, if present at all due to the presence of a high-coercivity magnet 410, are cancelled or insufficient to attract the flange 405 towards the EPM 326 and the key 220 associated with the EPM 326 is in an off or disabled state. Visually to a user, the key cap 302 may be in a recessed state and observed to be disabled.

At a second stage 430, a signal has been sent to the processor of the information handling system from the electropermanent magnet keyboard control system. This signal may be interpreted to the processor to send a first current pulse to the EPM key assembly of which the EPM 426 is associated. This first current pulse may draw the flange 405 a distance towards the EPM 426. However, as described herein, the first current pulse applied to the electrically conductive wire 420 may not fully change the polarity of the low-coercivity magnet 415. This initial charging of the low-coercivity magnet results in a weak actuation force if and when a user presses the key cap of the EPM key assembly. During the second stage 430 and into a third stage 435, the first current pulse and the polarity change at stage 415 decreases the distance of the flange 405 relative to the EPM 426 causing the flange 405 to be magnetically attracted to the EPM 426 as indicated in the third stage 435. At the third stage 435, the first current pulse ends and a period of time (referred to herein as a delay time or a passage of time) passes. As described herein, the delay time may be, in an embodiment, between 0.5 milliseconds and 2.5 milliseconds to allow the initial magnetic field strength H to settle at zero as indicated. As described herein, as the current applied to the electrically conductive wire 420 through the second stage 430 and third stage 435, the low-coercivity magnet 415 is not saturated and only some percentage of magnetic field strength effects the flange 405. In an embodiment as the current pulse is turned off at the electrically conductive wire 420, a first slight relaxation of the magnetic field created thus far may be observed but does not affect the distance between the flange 405 and the EPM 326.

At a fourth stage 440, a second current pulse is applied to the electrically conductive wire 420 coiled around the low-coercivity magnet 415. This second current pulse redirects a majority of the magnetic flux of the low-coercivity magnet 415 when the polarity aligns of the low-coercivity magnet 415 with the high-coercivity magnet 410 allowing the electrically conductive wire 420 to generate a stronger field that is capable of saturating the low-coercivity magnet 415. In the fourth stage 440, the flange 405 is brought close to or caused to abut the EPM 326 due to the application of the second current pulse to the electrically conductive wire 420. At a fifth stage 445, the current applied to the electrically conductive wire 420 is turned off causing a second relaxation or slight reduction in full saturation of the low-coercivity magnet 415. As a result of the second current pulse saturating the low-coercivity magnet 415, a maximum actuation force used to actuate the key by a user may be realized.

Figure 5:
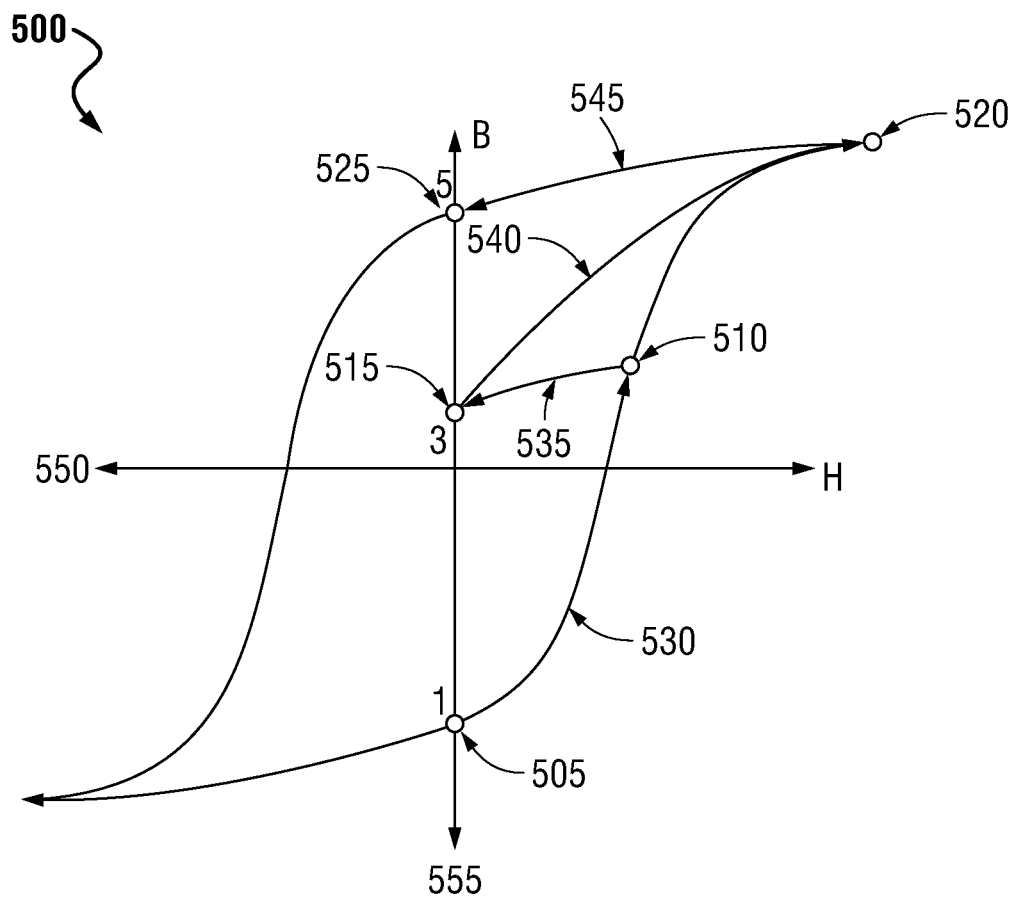
FIG. 5 is a graph showing a BH curve of a low-coercivity magnet of an electropermanent magnet (EPM) according to an embodiment of the present disclosure.

FIG. 5 is a graph showing a BH curve 500 of a low-coercivity magnet of an electropermanent magnet (EPM) according to an embodiment of the present disclosure. The BH curve 500 indicates a magnetic field strength "H" 550 relative to the flux density "B" 555 of the low-coercivity magnet. As depicted in the BH curve 500 a first current pulse 530 applied to the electrically conductive wire coiled around the low-coercivity magnet results in an increase in the magnetic field strength H of the low-coercivity magnet through a first point 505 and to a second point 510. However, that first current pulse is not able to generate enough magnetic field strength H to saturate the low-coercivity magnet flux density B. This is because, in an example, a low power source produces a low power first current pulse thereby reducing the power consumption used to increase the magnetic field strength H of the low-coercivity magnet. This also results in lower costs in manufacturing by eliminating the use of a relatively high power current source.

After application of the first current pulse 530, the magnetic field strength H relaxes 535 down to point 515 resting the magnetic flux density level B at a third point 515. Again, the first current pulse 530 did not fully saturate the low-coercivity magnet such that any residual field is only a portion of a potential maximum filed strength possible at the low-coercivity magnet.

After a passage of time, the second current pulse 540 is applied to the electrically conductive wire coiled around the low-coercivity magnet. The application of this second current pulse 540 results in a stronger magnetic force applied to the flange 405 while the magnetic field strength H of the low-coercivity magnet 415 is saturated at a fourth point 520. Again, a second relaxation 545 of the magnetic field strength H causes the flux density B 555 of the low-coercivity magnet to rest at a fifth point 525. Fifth point 525 represents an increase key force generated by the EPM as described herein.

In an embodiment, the reverse voltage may be applied to the electrically conductive wire coiled around the electrically conductive wire. As a result, the magnetic force B 555 and H field 550 strength is reduced. Consequently, as described herein, the EPM key assembly associated with the low-coercivity magnet is recessed and rendered inoperable.

Figure 6:
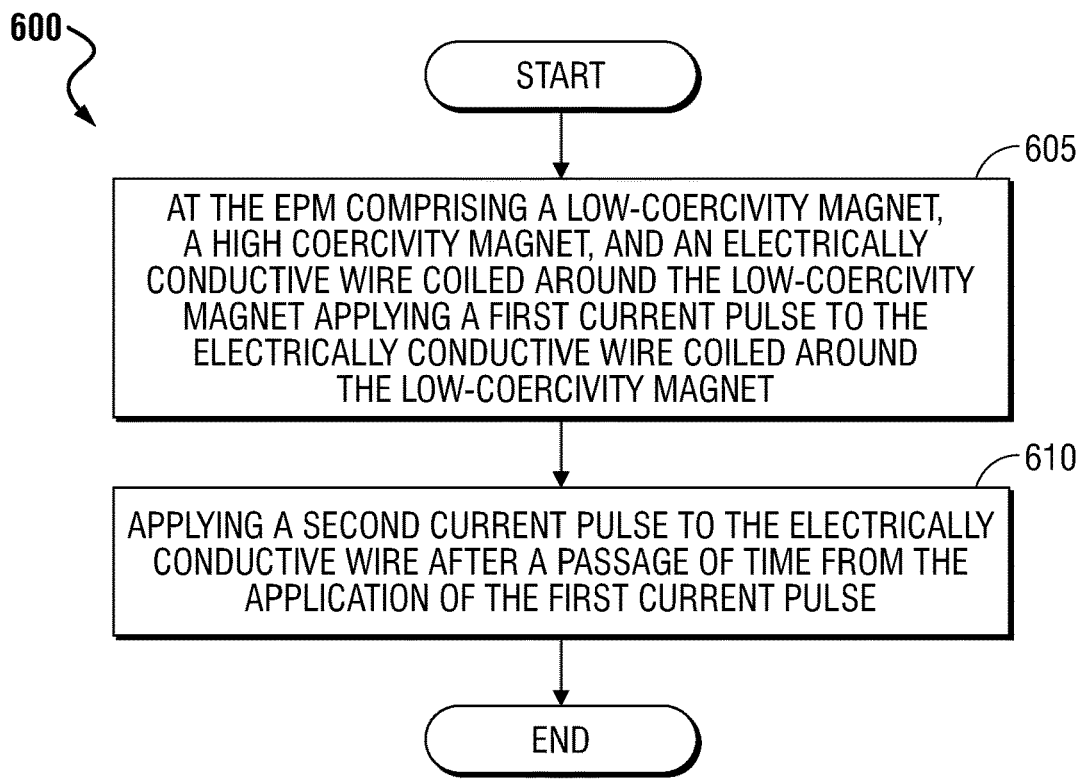
FIG. 6 is a flow diagram illustrating a method of charging an electro-permanent magnet (EPM) key assembly of an information handling system according to an embodiment of the present disclosure.

FIG. 6 is a flow diagram illustrating a method 600 of charging an electro-permanent magnet (EPM) key assembly of an information handling system according to an embodiment of the present disclosure. The method 600 may start with, at the EPM key assembly comprising a low-coercivity magnet, a high coercivity magnet, and an electrically conductive wire coiled around the low-coercivity magnet applying 605 a first current pulse to the electrically conductive wire coiled around the low-coercivity magnet. As described herein, the timing and initiation of application of the first current pulse to the electrically conductive wire may be initiated after the processor of the information handling system has executed instructions per the electropermanent magnet keyboard control system. Upon execution of these instructions, the processor causes the application of the first current pulse to the electrically conductive wire as described herein. Again, this results in a first magnetic field state of the low-coercivity magnet causing the flange to be drawn close to the EPM. However, the magnetic force B of the low-coercivity magnet and high-coercivity magnet combination is not maximized after this first current pulse.

The method 600 may continue with applying 610 a second current pulse to the electrically conductive wire after a passage of time from the application of the first current pulse. Similar to the first current pulse, the second current pulse is sent to the electrically conductive wire coiled around the low-coercivity magnet upon execution of instructions received by a processor of the information handling system by the electropermanent magnet keyboard control system. As the second current pulse is applied to the electrically conductive wire, the magnetic force of the low-coercivity magnet is maximized causing the combined magnetic field and force of the low-coercivity magnet and high-coercivity magnet 410 are combined to increase a resistance force against a key cap of the EPM key assembly 300 as described herein. In this manner, control of individual EPM key assemblies may occur using a lower voltage power source and drivers with a minimized effect by a user.

Figure 7:
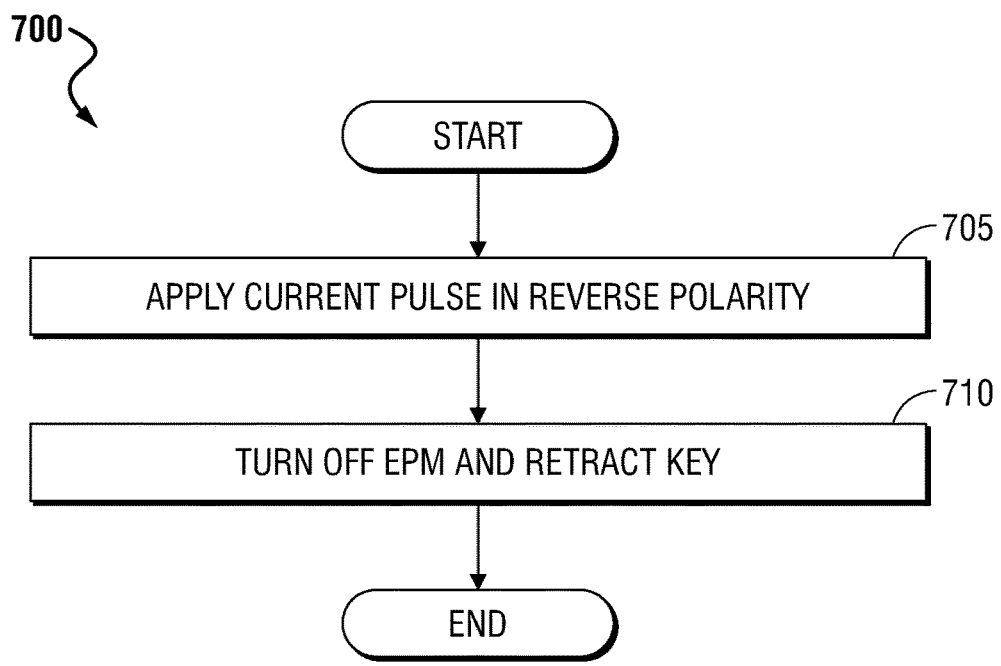
FIG. 7 is a flow diagram illustrating a method of discharging an electro-permanent magnet (EPM) key assembly of an information handling system according to an embodiment of the present disclosure.

FIG. 7 is a flow diagram illustrating a method 700 of discharging an electro-permanent magnet (EPM) key assembly of an information handling system according to an embodiment of the present disclosure. The method 700 described in FIG. 7 may follow the method 600 described in connection with FIG. 6. The method 700 may begin with applying 705 a current pulse in a reverse direction to the polarity as that used to increase the magnetic force of the low-coercivity magnet as described in connection with FIG. 6. Again, this application 705 of the current pulse to reverse polarity may be accomplished after the processor has executed instructions provide to it by the information handling system and specifically the electropermanent magnet keyboard control system therein.

The result of applying 705 the current pulse to reverse polarity of the low-coercivity magnet causes the EPM to be turned off 710 resulting in the retraction of the key cap of the EPM key assembly as described herein. As described herein, the process of "turning on" and "turning off" the EPM so as to raise and retract the EPM key assembly as described herein may be conducted at any time and any number of times as the user interacts with the information handling system. In specific embodiments, execution of computer readable instructions associated with applications being executed by the processor may cause any of the EPM key assemblies to raise and retract based on output presented by an application being executed. In other embodiments, the user may define if and when any of the EPM key assemblies are raised or retracted thereby allowing for customization of any input device associated with the information handling system.

Figure 8:
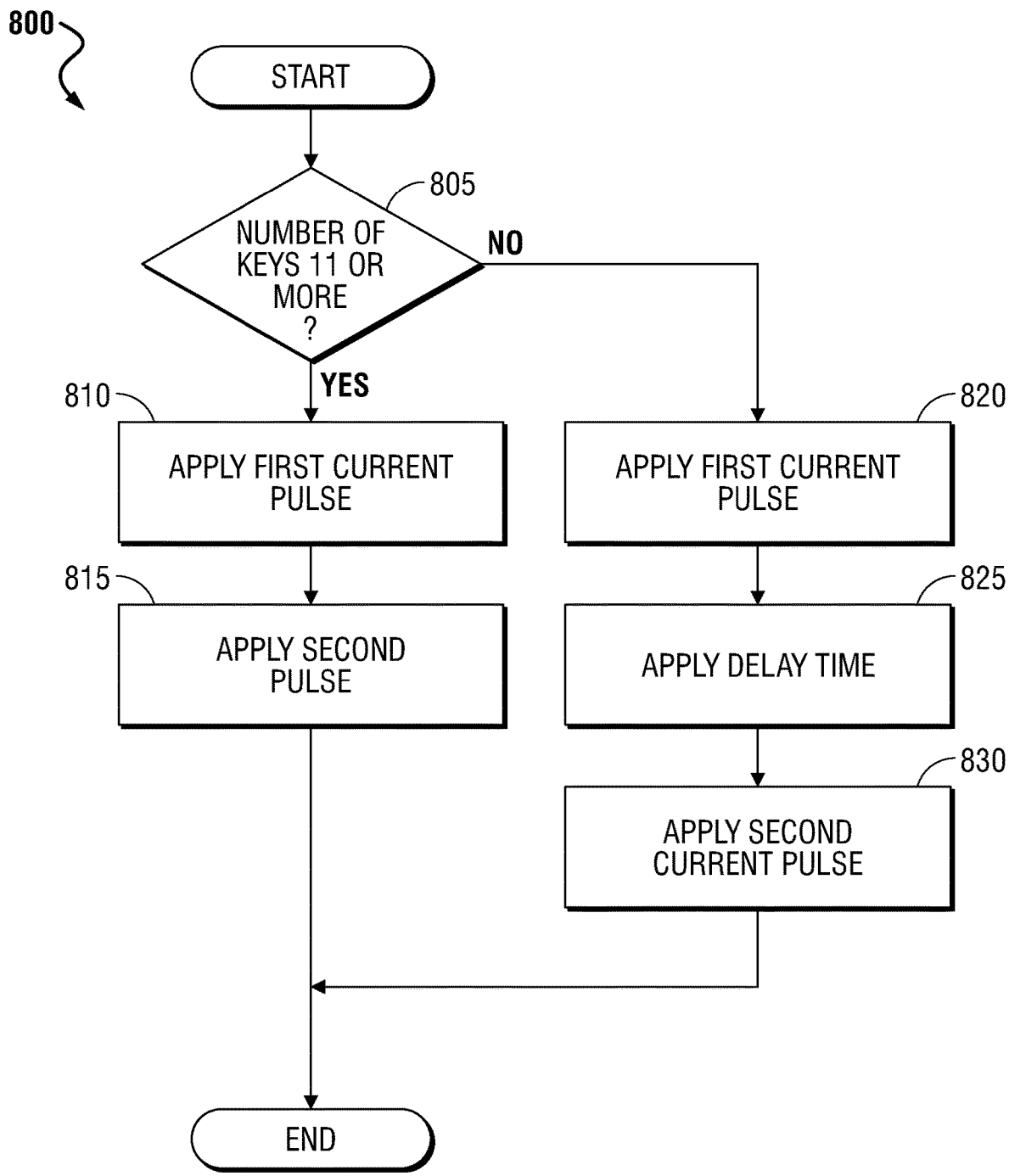
FIG. 8 is a flow diagram illustrating a method of charging an electro-permanent magnet (EPM) key assembly of an information handling system according to an embodiment of the present disclosure.

FIG. 8 is a flow diagram illustrating a method 800 of charging an electro-permanent magnet (EPM) key assembly of an information handling system according to an embodiment of the present disclosure. In this example, the number of EPM key assemblies to be charged determines the course of action that is to be taken by the processor. As described herein, the method 800 may begin with determining 805 whether the number of keys is 11 keys or more. In other embodiments, it is contemplated that any threshold number of EPM key assemblies may be used at 805 as a triggering number. In an example, the threshold number of EPM key assemblies may depend on how much power is made available, the available drivers provided, or whether individual EPM key assemblies are used more often than others. Where the determination 805 is NO, the method 800 may apply 820 a first current pulse to all of the EPMs of the EPM key assemblies concurrently. In an embodiment the temporal length of the application 820 of the first current pulse may be between 150 and 250 microseconds. A delay time may then be applied 825. In an embodiment, the delay time may be between 0.5 milliseconds and 2.5 milliseconds. In another embodiment, the delay time may be calculated using the following equation:

$$(2{,}000\ \mu sec \times \{(210\ \mu sec)(\#of\ keys\ to\ be\ activated)\}) \quad \text{Eq. 1}$$

The delay time may be followed by the application 830 of the second current pulse to each of the EPMs concurrently. In an embodiment the temporal length of the application 830 of the second current pulse may be between 250 and 350 microseconds.

Where the determination at 805 is YES the method 800 may apply at 810 a first current pulse to all of the EPMs of the EPM key assemblies in a round robin fashion. That is, where the number of keys exceed 10 keys, the application of the first current pulse is done to each EPM successively until the first current pulse has been applied to all EPMs. By the time the second current pulse is to be applied 815 to the EPMs, the time delay has passed for the initial EPM to which the first current pulse was applied 810. Because the round robin process occurs so quickly, the user may not be able to discern that each key is being raised sequentially and merely discern that they are being raised concurrently. Also, by the time the user is able to address any given key and provide input to the information handling system, the second pulse will have been applied 815 to each of the EPMs and the maximum resistive force may be felt by the user. In another embodiment, the threshold number of EPM key assemblies (eq. 1) may receive concurrent current pulses, such as high-use EPM key assemblies, followed by round robin current pulses to the remaining EPM key assemblies. Selection of the order of any round robin EPM key assemblies may be made dependent on a use-frequency of the keys or a location on a keyboard, for example. For example, the round robin processes in application of the first current pulse, the second current pulse, or both may be addressed to more central EPM key assemblies on the keyboard followed by perimeter EPM key assemblies. In another embodiment, frequently used EPM key assemblies that include an "ENTER" key, a "SPACE" key, a "SHIFT" key, among others alphanumeric keys among the keyboard may receive either of the first and/or second current pulses in a round robin fashion.

The blocks of the flow diagrams of FIGS. 6 through 8 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An electro-permanent magnet (EPM) key assembly of an information handling system comprising: a pair of scissor plates operably connected to a base contact assembly including an EPM such that each of the pair of scissor plates may rotate away from one another in the presence of downward force on a key cap situated atop the pair of scissor plates for actuation of the EPM key assembly; the EPM comprising a low-coercivity magnet and a high-coercivity magnet; wherein an application of a first current pulse applied to an electrically conductive wire coiled around the low-coercivity magnet places the EPM in a first on state to assert a first magnetic field on a ferromagnetic flange operatively coupled to rotate with at least one scissor plate about a hinge; wherein an application of a second current pulse applied to the electrically conductive wire places the EPM in a second on state to increase the magnetic field on the ferromagnetic flange; and wherein the second current pulse is applied to the electrically conductive wire after a passage of time from the application of the first current pulse.

2. The EPM key assembly of claim 1, wherein an application of an opposite current pulse to the electrically conductive wire places the EPM in an off state to release the ferromagnetic flange from the magnetic field and retract the key cap.

3. The EPM key assembly of claim 1, wherein the passage of time is between 0.5 to 2.5 milliseconds.

4. The EPM key assembly of claim 1, wherein application of the first current pulse applied to the electrically conductive wire causes the key cap to have a downward force resistance of between 10 and 20 grams of force.

5. The EPM key assembly of claim 1, wherein application of the second current pulse applied to the electrically conductive wire causes the key cap to have a downward force resistance of between 50 and 70 grams of force.

6. The EPM key assembly of claim 1, wherein the information handling system comprises a plurality of EPM key assemblies, each of the individual EPM key assemblies being associated with an individual key presented on a keyboard of the information handling system.

7. The EPM key assembly of claim 6, wherein the application of the first and second current pulse is completed in an order based on the location of keys present on the keyboard.

8. The EPM key assembly of claim 6, wherein when the number of keys exceeds a threshold number of keys, the application of the first and second current pulse to each of the plurality of EPM key assemblies is completed by applying the first current pulse to each individual electrically conductive wire of the plurality of EPMs in a round robin fashion, waiting for a passage of time, and applying the second current pulse to each individual electrically conductive wire of the plurality of EPMs in a round robin fashion.

9. The EPM key assembly of claim 6, wherein when the number of keys is less than a threshold number of keys, the application of the first and second current pulse on each of the plurality of EPM key assemblies is completed by applying the first current pulse to each individual electrically conductive wire of the plurality of EPMs, waiting for a passage of time, and applying the second current pulse to each individual electrically conductive wire of the plurality of EPMs.

10. A method of controlling an electro-permanent magnet (EPM) key assembly of an information handling system, comprising:

at the EPM key assembly comprising a low-coercivity magnet, a high coercivity magnet, and an electrically conductive wire coiled around the low-coercivity magnet:
applying a first current pulse to the electrically conductive wire coiled around the low-coercivity magnet to attract a ferromagnetic flange operatively coupled to at least one scissor plate to raise the EPM key assembly to a neutral position;
applying a second current pulse to the electrically conductive wire after a passage of time from the application of the first current pulse to increase an actuation force used to actuate the EPM key assembly.

11. The method of claim 10, wherein the information handling system comprises a plurality of EPM key assemblies and wherein each EPM key assembly may be selectively activated independent of any other EPM key assembly.

12. The method of claim 11, wherein when the number of EPM key assemblies is less than a threshold number of EPM key assemblies, the application of the first and second current pulse on each of the plurality of EPM key assemblies is completed by applying the first current pulse to each individual electrically conductive wire of the plurality of EPMs, waiting for a passage of time, and applying the second current pulse to each individual electrically conductive wire of the plurality of EPMs.

13. The method of claim 11, wherein when the number of EPM key assemblies exceeds a threshold number of EPM key assemblies, the application of the first and second current pulse to each of the plurality of EPM key assemblies is completed by applying the first current pulse to each individual electrically conductive wire of the plurality of EPMs in a round robin fashion, waiting for a passage of time, and applying the second current pulse to each individual electrically conductive wire of the plurality of EPMs in a round robin fashion.

14. The method of claim 10, comprising:
determining a length of the passage of time between the application of the first and second current pulses, wherein the length of the passage of time is determined based on: a voltage of the first current applied to the electrically conductive wire, a distance between the EPM key assembly and a key cap associated with the EPM, or a weight of the key cap.

15. An electro-permanent magnet (EPM) key assembly of an information handling system comprising:
a cap support plate comprising a printed circuit board with a pressure sensor to record keystrokes for mounting the EPM key assembly;
a pair of scissor plates operably connected to a base contact assembly including an EPM such that each of the pair of scissor plates may rotate away from one another in the presence of downward force on a key cap;
the key cap situated atop the pair of scissor plates for actuation of the EPM key assembly;
the EPM having an on state to assert a magnetic field on a ferromagnetic flange operatively coupled to rotate with at least one scissor plate about a hinge and an off state to release the ferromagnetic flange from the magnetic field and retract the key cap;
wherein actuation of the on state comprises:
application of a first current pulse to an electrically conductive wire coiled around a low-coercivity magnet; and application of a second current pulse to the electrically conductive wire after a passage of time has passed from the application of the first current pulse.

16. The EPM key assembly of claim 15, wherein an application of an opposite current pulse at the electrically conductive wire releases the ferromagnetic flange from the magnetic field and retract the key cap.

17. The EPM key assembly of claim 15, wherein the information handling system comprises a plurality of EPM key assemblies, each of the individual EPM key assemblies being associated with an individual key presented on a keyboard of the information handling system.

18. The EPM key assembly of claim 17, wherein the application of the first and second current pulse is completed based on the number of keys present on the keyboard such that when the number of keys exceeds 11 keys, the application of the first and second current pulse to each of the plurality of EPM key assemblies is completed by applying the first current pulse to each individual electrically conductive wire of the plurality of EPMs in a round robin fashion, waiting for the passage of time, and applying the second current pulse to each individual electrically conductive wire of the plurality of EPMs in a round robin fashion.

19. The EPM key assembly of claim 17, wherein the application of the first and second current pulse is completed based on the number of keys present on the keyboard such that when the number of keys is less than 11 keys, the application of the first and second current pulse on each of the plurality of EPM key assemblies is completed by concurrently applying the first current pulse to each individual electrically conductive wire of the plurality of EPMs, waiting for a passage of time, and concurrently applying the second current pulse to each individual electrically conductive wire of the plurality of EPMs.

* * * * *